(12) United States Patent
Park et al.

(10) Patent No.: US 12,072,484 B2
(45) Date of Patent: Aug. 27, 2024

(54) POWER EFFICIENCY OPTIMIZATION METHOD OF LC RESONANT DRIVER FOR MEMS MIRRORS

(71) Applicant: MICROSOFT TECHNOLOGY LICENSING, LLC, Redmond, WA (US)

(72) Inventors: Chang Joon Park, Sunnyvale, CA (US); Martin Francis Galinski, Santa Clara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 643 days.

(21) Appl. No.: 17/353,724

(22) Filed: Jun. 21, 2021

(65) Prior Publication Data
US 2022/0404611 A1 Dec. 22, 2022

(51) Int. Cl.
G02B 26/08 (2006.01)
H03H 7/00 (2006.01)
H03H 9/15 (2006.01)

(52) U.S. Cl.
CPC .......... G02B 26/0833 (2013.01); H03H 9/15 (2013.01); *H03H 2007/006* (2013.01); *H03H 2009/155* (2013.01)

(58) Field of Classification Search
CPC .. G02B 26/0833; G02B 26/0858; H03H 9/15; H03H 2007/006; H03H 2009/155; H10N 30/802
USPC .......................................... 333/32, 186, 197
See application file for complete search history.

(56) References Cited

U.S. PATENT DOCUMENTS

| 8,334,729 B1 * | 12/2012 | Khlat ....................... H03H 7/38 333/32 |
| 9,741,245 B1 | 8/2017 | Fischer |
| 10,551,914 B2 | 2/2020 | Price et al. |
| 10,627,899 B2 | 4/2020 | Price et al. |

(Continued)

FOREIGN PATENT DOCUMENTS

WO 2005078916 A1 8/2005

OTHER PUBLICATIONS

"International Search Report and Written Opinion Issued in PCT Application No. PCT/US22/029086", Mailed Date: Sep. 2, 2022, 13 Pages.

*Primary Examiner* — Rakesh B Patel
*Assistant Examiner* — Jorge L Salazar, Jr.
(74) *Attorney, Agent, or Firm* — Scott Y. Shigeta; Newport IP, LLC

(57) ABSTRACT

Techniques are described herein for dynamically adjusting a resonant frequency of a resonance circuit to optimize power transfer to a mirror device such as a MEMS mirror. A variable capacitance circuit can be operated responsive to a bias control signal. A capacitance control circuit can vary the bias control signal to the resonance circuit responsive to a sense signal. The sense circuit is configured to generate the sense signal responsive to an output of the mirror device. By monitoring a signal level from the output of the mirror device 130, and adjusting the bias control signal of the resonance circuit, the exact resonance frequency of the resonance circuit can be adjusted until a peak signal level is observed, thus improving the efficiency of the energy transferred from the driver circuit 110 to the mirror device 130, and counteracting the impact of parasitic capacitances on the resonance.

20 Claims, 9 Drawing Sheets

(56) References Cited

U.S. PATENT DOCUMENTS

2013/0128328 A1  5/2013  Honda et al.
2019/0121121 A1  4/2019  Galinski et al.

* cited by examiner

801. OLD_BIAS = START_VAL

802. SET (OLD_BIAS)

803. GET (OLD_PEAK)

804. DIR = +1

805. FIRST = TRUE

806. NEW_BIAS = OLD_BIAS + DIR*DELTA

807. SET (NEW_BIAS)

808. GET (NEW_PEAK)

809. IF (NEW_PEAK > OLD_PEAK)

a.    OLD_PEAK = NEW_PEAK b.    OLD_BIAS = NEW_BIAS c.    GOTO 806

810. IF (FIRST)

a.    DIR = (-1)*DIR b.    FIRST = FALSE c.    GOTO 806

811. BIAS = OLD_BIAS

812. DONE

POWER EFFICIENCY OPTIMIZATION METHOD OF LC RESONANT DRIVER FOR MEMS MIRRORS

BACKGROUND

Laser beam scanning ("LBS") display devices form displayed images by using mirrors, such as microelectromechanical systems ("MEMS") mirrors. The MEMS mirror directs a laser beam onto a display region at a particular scan rate (e.g., a vertical or horizontal scan frequency), where the mirrors may move over the course of a frame to control the location in the display region toward which the laser beam is directed. Some LBS displays use two mirrors, a fast-scan mirror that scans under resonance and a slow-scan mirror that scans linearly.

An image can be created by time multiplexing pulses from the laser beam spatially across a 2-D image plane with the motion of the MEMS mirror(s) creating the overall field of view (FOV). Each MEMS mirror has an inherent mechanical resonant frequency. One or more Piezo-Electric (PE) actuators are utilized to drive the MEMS mirror that deflects the laser, where the PE actuators cause the MEMS mirror(s) to oscillate at a frequency. An LC resonance driver is used to drive the PE actuators to achieve the desired operating frequency of the MEMS mirror(s).

Given the growing number of applications and industries that use laser beam scanning display devices, there is a growing need to improve the efficiency, reliability and safety of such products. The disclosure made herein is presented with respect to these and other considerations.

SUMMARY

Techniques are described herein for dynamically adjusting a resonant frequency of a resonance circuit to optimize power transfer to a mirror device such as a MEMS mirror. A variable capacitance circuit can be operated responsive to a bias control signal. A capacitance control circuit can vary the bias control signal to the resonance circuit responsive to a sense signal. The sense circuit is configured to generate the sense signal responsive to an output of the mirror device. By monitoring a signal level from the output of the mirror device 130, and adjusting the bias control signal of the resonance circuit, the exact resonance frequency of the resonance circuit can be adjusted until a peak signal level is observed, thus improving the efficiency of the energy transferred from the driver circuit 110 to the mirror device 130, and counteracting the impact of parasitic capacitances on the resonance.

It should be appreciated that the above-described subject matter may also be implemented as part of an apparatus, system, or as part of an article of manufacture. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The Detailed Description is described with reference to the accompanying figures. References made to individual items of a plurality of items can use a reference number with a letter of a sequence of letters to refer to each individual item. Generic references to the items may use the specific reference number without the sequence of letters.

DETAILED DESCRIPTION

Figure 1:
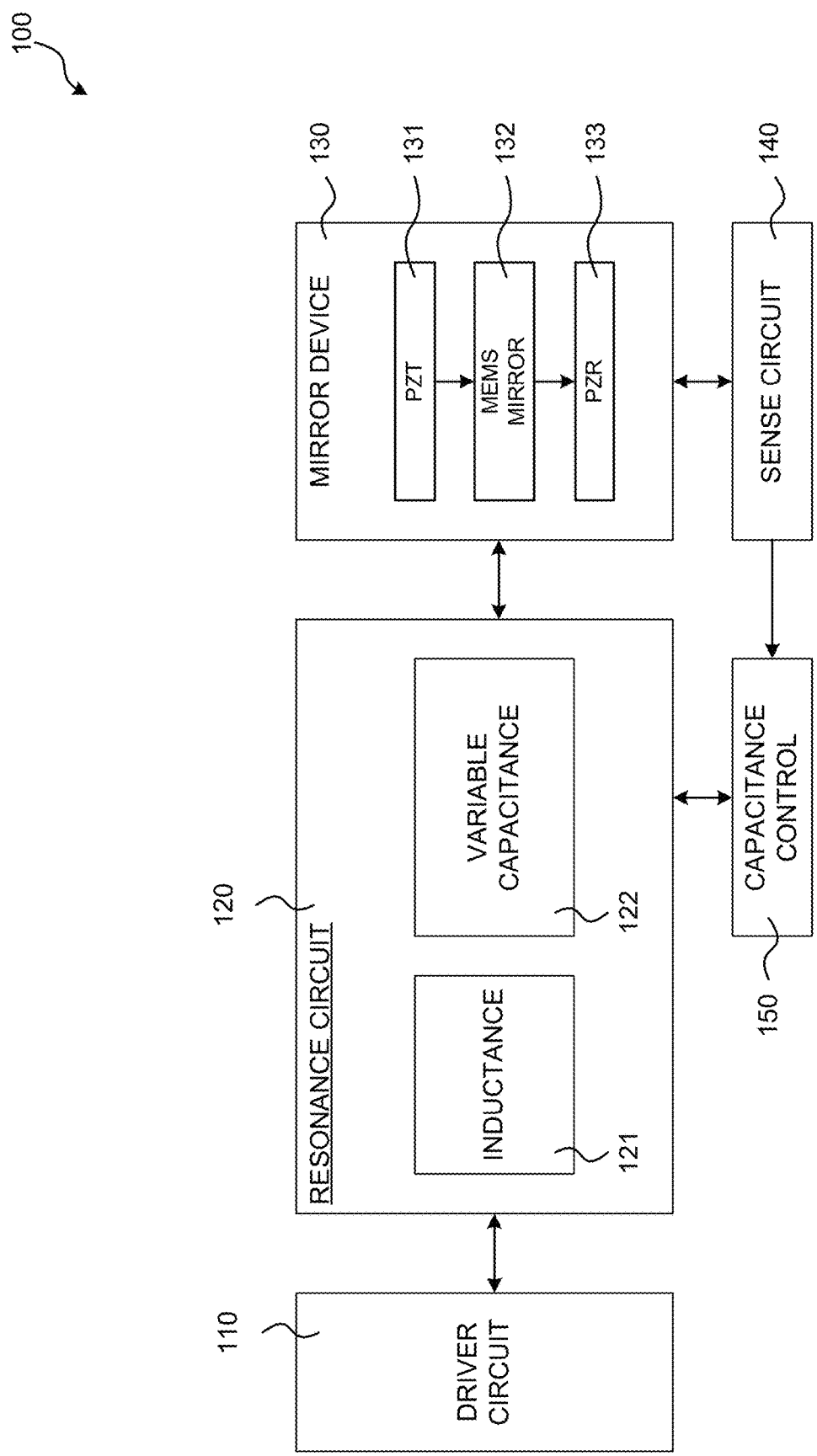
FIG. 1 shows a schematic diagram of an example system with enhanced resonance control.

In the following detailed description, reference is made to the accompanied drawings, which form a part hereof, and which is shown by way of illustration, specific example configurations of which the concepts can be practiced. These configurations are described in sufficient detail to enable those skilled in the art to practice the techniques disclosed herein, and it is to be understood that other configurations can be utilized, and other changes may be made, without departing from the spirit or scope of the presented concepts. The following detailed description is, therefore, not to be taken in a limiting sense, and the scope of the presented concepts is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices and/or components. The terms "circuit" and "component" means either a single component or a multiplicity of components, either active and/or passive, that are coupled to provide a desired function. The term "signal" means at least a power, current, voltage, or data signal.

Laser beam scanning ("LBS") display devices form displayed images by using mirrors, such as microelectromechanical systems ("MEMS") mirrors. The MEMS mirror(s) direct a laser beam onto a display region at a particular scan rate (e.g., a vertical or horizontal scan frequency), where the mirrors may move over the course of a frame to control the location in the display region toward which the laser beam is directed. Some LBS displays use two MEMS mirrors, a fast-scan mirror that scans under resonance and a slow-scan mirror that scans linearly.

An image can be created by time multiplexing pulses from the laser beam spatially across a 2-D image plane with the motion of the MEMS mirror(s) creating the overall field of view (FOV). Each MEMS mirror has an inherent mechanical resonant frequency. One or more Piezo-Electric (PE) actuators may be utilized to drive the MEMS mirror to deflect the laser beam, where the PE actuators cause the MEMS mirror(s) to oscillate at a frequency. An LC resonance driver is used to drive the PE actuators to achieve the desired operating frequency of the MEMS mirror(s).

As described herein, the LC resonant driver may be implemented according a scheme where a dynamic resonance control is employed by the MEMs mirror. The resonant frequency of the mirror is an innate property of the MEMs mirror design. The overall system design will dictate what the target frequency is for the MEMS mirror(s). The Piezo-Electric (PE) actuators, which are often implemented as thin film devices, can be driven by 180 degrees out of phase sinusoidal signals. The driving strength of the mirror(s) relies on the amplitude of the sinusoidal signals that drive the PE actuator(s), where the target frequency is specified to support a target number of scan cycles (e.g., horizontal scans) per display field.

The presently disclosed techniques may be employed to provide for efficient use of power, where the required drive signal energy may be reduced by the operation of the dynamic resonance control, which can boost the signal at the target frequency without use of unnecessarily high-power signals. An additional benefit of the presently disclosed techniques is that device reliability and safety aspects may be improved.

FIG. 1 shows a schematic diagram of an example system with enhanced resonance control, arranged in accordance with aspects of the present invention. System 100 includes a driver circuit 110, a resonance circuit 120, a mirror device 130, a sense circuit 140, and a capacitance control circuit 150.

An output of the driver circuit 110 is coupled to an input of the resonance circuit 120. An output of the resonance circuit is coupled to an input of the mirror device 130. An output of the mirror device is coupled to an input of the sense circuit 140. An output of the sense circuit is coupled to an input of the capacitance control circuit 150. An output of the capacitance control circuit 150 is coupled to a bias control input of the resonance circuit 120.

The resonance circuit 120 includes an inductance circuit 121, and a variable capacitance circuit 122. The inductance circuit 121 and the variable capacitance circuit 122 may together form at least part of an LC resonance circuit, sometimes called a resonant tank circuit or an LC tank circuit. The resonant frequency of the resonance circuit can be varied by operation of the variable capacitance circuit 122, which is responsive to the bias control signal received from the capacitance control circuit 150. The capacitance control circuit 150 is configured to vary the bias control signal to the resonance circuit responsive to a sense signal. The sense circuit 140 is configured to generate the sense signal responsive to an output of the mirror device 130. By monitoring the signal level from the output of the mirror device 130, and adjusting the bias control signal of the resonance circuit, the exact resonance frequency can be adjusted until a peak signal level may be observed, thus improving the efficiency of the energy transferred from the driver circuit 110 to the mirror device 130.

The mirror device 130 may include a piezo-electric (PZT) material 131, a mechanical MEMs mirror 132, and a piezoresistive (PZR) material 132. The piezo-electric material, which is typically Lead Zirconate Titanate (hence PZT), may be used as a piezo-electric driver (or actuator) that drives the MEMS mechanical mirror 132 in response to a drive signal (e.g., a voltage, current) from the resonance circuit 120. The PZR material 133 is a piezo-resistive sensor that generates a feedback signal from the mirror device 130, which measures a response of the MEMS mirror 132.

The driver circuit 110 is configured to provide an alternating signal (e.g., an AC signal such as AC power, AC voltage, or AC current) to the resonance circuit 120. The resonance circuit 120 has a high-Q and is thus configured to amplify the AC signal received from the driver circuit 110, and also configured to couple the amplified AC signal to the mirror device 130. The resonance circuit 120 uses the inductance circuit 121 and variable capacitance circuit 122, along with the inherent capacitance of the mirror device 130, to amplify the AC signal at a resonant frequency of the mirror device 130.

The output various input and output ports illustrated in FIG. 1 appear as individual wires, but may correspond to multiple wires, which may be singled ended or differential signal. The operation the system of FIG. 1 will be further explained with reference to the other figures described herein.

Figure 2:
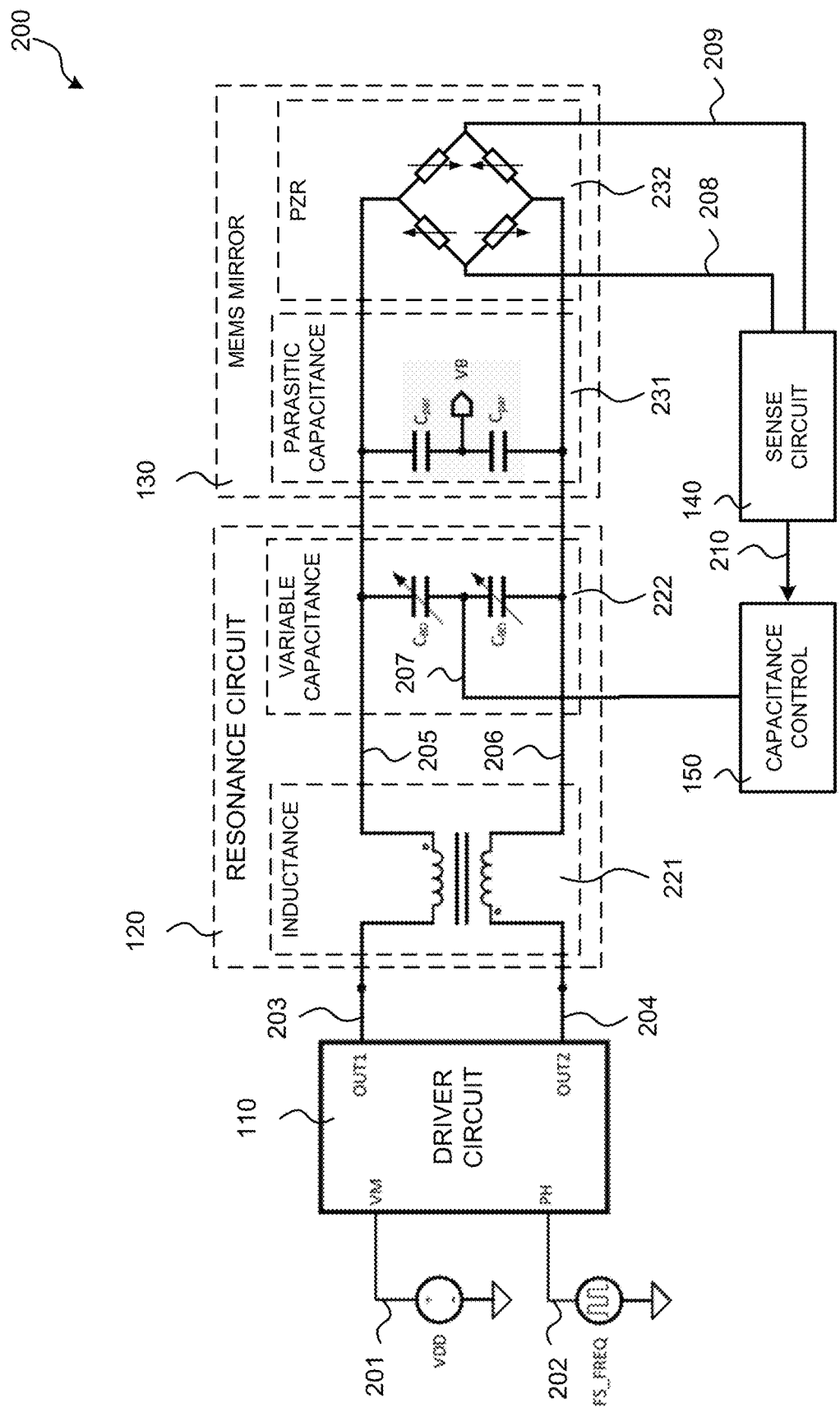
FIG. 2 shows a detailed schematic diagram of another example system with enhanced resonance control.

FIG. 2 shows a detailed schematic diagram of another example system 200 with enhanced resonance control, arranged in accordance with aspects of the present invention. System 200 includes a driver circuit 110, a resonance circuit 120, a mirror device 130, a sense circuit 140, and a capacitance control circuit 150. System 200 also include a DC input source (VDD) and an input frequency (FS_FREQ).

Driver circuit 110 includes a first input (VM) 201, a second input (PH) 202, a first output (OUT1) 203, and a second output (OUT2) 204. The DC input source (VDD) is coupled to the first input 201, while the input frequency (FS_FREQ) is coupled to the second input 202. The resonance circuit 120 includes a first input that is coupled to the first output 203 of the driver circuit 110, a second input that is coupled to the second output 204 of the driver circuit 110, a first output 205, a second output 206, and a control input 207. Mirror device 130 include a first input that is coupled to the first output 205 of the resonance circuit 120, a second input that is coupled to the second output 206 of the resonance circuit 120, a first output 208 and a second output 209. The sense circuit 140 includes a first input that is coupled to the first output 208 of the mirror device 130, a second input that is coupled to the first output 209 of the mirror device 130, and an output 210. The capacitance control circuit 150 includes a first input that is coupled to the output 210 of the sense circuit 140, and an output that is coupled to the control input of the resonance circuit 120.

Although described as inputs and outputs, these are merely terms of convenience and the couplers may allow current, voltage, or power to flow in both directions of the indicated input or output as may be required for proper operation. For example, since the signal driving the mirror device 130 is an AC signal, the direction of the signal is not strictly in one direction to the port, and the ports themselves may be viewed as bidirectional.

Additionally, the various input ports are illustrated as individual wires, which together may be implemented as differential signals instead of singled-ended (e.g., ground referenced) signals. For example, outputs 203 and 204 of the driver circuit may be observed as a differential signal (203, 204) from the driver circuit that drives the resonance circuit 120; while outputs 205 and 206 of the resonance circuit may be observed as a differential signal (205, 206) that drives the mirror device 130.

The resonance circuit 120 in system 200 further includes an inductance circuit 221, and a variable capacitance circuit 222. The inductance circuit 221 is illustrated as a cross-coupled inductor. Cross-coupled inductors have a mutual inductance that is determined by the inductor design (e.g., number of windings in the coil, polarity, etc.), where energy stored in the magnetic field is induced by the flux linkage between the inductors. A first of the cross-coupled inductors is series coupled between the first output of the driver circuit 203 and the first output of the resonance circuit 205; while a second of the cross-coupled inductors is series coupled between the second output of the driver circuit 204 and the second output of the resonance circuit 206. The polarity of the first of the cross-coupled inductors is shown with the polarity at the output of the resonance circuit (e.g., node 205); while the polarity of the second cross-coupled inductor is shown with the polarity at the second output 204 of the driver circuit 110 (e.g., node 204); thus indicating the first and second of the cross-coupled inductors having opposite polarities.

The variable capacitance circuit 221 is illustrated as two variable capacitors (CBD) that are series coupled between the first output 205 and the second output 206 of the resonance circuit 120. A first of the variable capacitors is series coupled between the first output of the resonance circuit 205 and a common point; while a second of the variable capacitors is series coupled between the common point and the second output of the resonance circuit 206. The common point of the two variable capacitors (CBD) are coupled to a bias control input 207 of the resonance circuit.

The mirror device 130 in system 200 further includes a parasitic capacitance circuit 231 and a PZR circuit 232. The parasitic capacitance circuit 231 is illustrated as two parasitic capacitors ($C_{PAR}$) that are also series coupled between the first output 205 and the second output 206 of the resonance circuit 120. The common point of the two parasitic capacitors ($C_{PAR}$) are coupled to a bias control input VB of the mirror device 130. The PZR circuit 232 is illustrated as a resistive bridge that has variations in the resistance values based on strain that is applied to the PZR by the motion of the mirror device 130. The resistive bridge of the PZR circuit 232 includes a first input coupled to the first output 205 of the resonance circuit 120; a second input coupled to the second output 206 of the resonance circuit 120; a first output coupled to the first output 208 of the mirror device 130; and a second output coupled to the second output 200 of the mirror device 130. Thus, the output of the PZR circuit 232 in the mirror device 130 corresponds to an input of the sense circuit 140.

The variable capacitance circuit 222 and the inductance circuit 221 may together form at least part of an LC resonance circuit. For example, the parasitic capacitance 231 of the mirror device 130 may also form part of the LC resonance circuit. Other parasitic components may also exist in the LC resonance circuit as a result of manufacturing and component limitations. For example, stray resistance may exist between components that result from physical circuit layout considerations, as well as additional parasitic capacitances and inductances that may exist between adjacent circuit traces on a physical circuit board. Moreover, non-ideal capacitors include an inherent internal resistance and inductance, while non-ideal inductors include an inherent resistance and capacitance. Overall, these collective parasitic values have an impact on the actual observable resonant frequency of the LC resonance circuit.

Figure 3A:
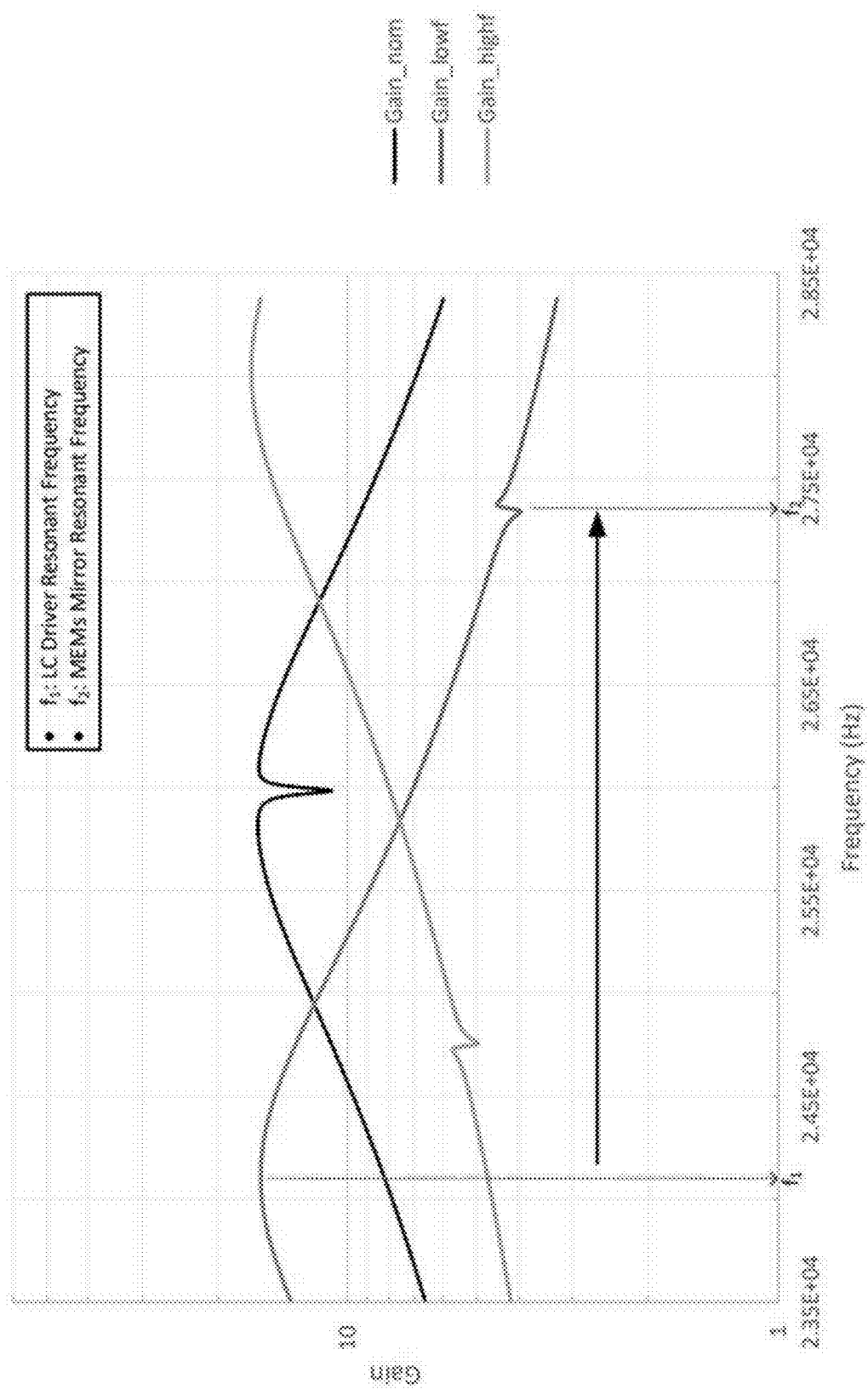
FIG. 3A shows a graph of gain variations in an example system.

The parasitic capacitance yields an observable difference between the driver resonant frequency and the inherent MEMs mirror resonant frequency across the PVT variations. FIG. 3A shows a graph of gain variations in an example system. The notch response of the gain is created at MEMs Mirror Resonant frequency, which causes the signal gain loss. Therefore, LC Driver Resonant Frequency and MEMs Mirror Resonant frequency should be aligned at the same frequency to achieve the most efficient driving capability in terms of the power consumption.

The present disclosed techniques describe a DC Bias control scheme, where the DC bias is utilized to adjust the resonant frequency of the LC tank circuit. The resonance created by the LC tank consists of the cross-coupled inductor, on-board capacitors, and at least the parasitic capacitance due to the MEMs mirror. Other parasitic capacitances, inductances, and resistances noted above may also contribute to an error in the LC tank circuits resonant frequency. If the target resonant frequency from the overall system design is a low frequency, a high value inductor would need to be implemented, which is costly and may be quite bulky with a large physical footprint. However, the cross-coupled inductor can achieve a high inductance value due to the mutual inductance with a lower inductance value that is less bulky with a smaller physical footprint.

Figure 3B:
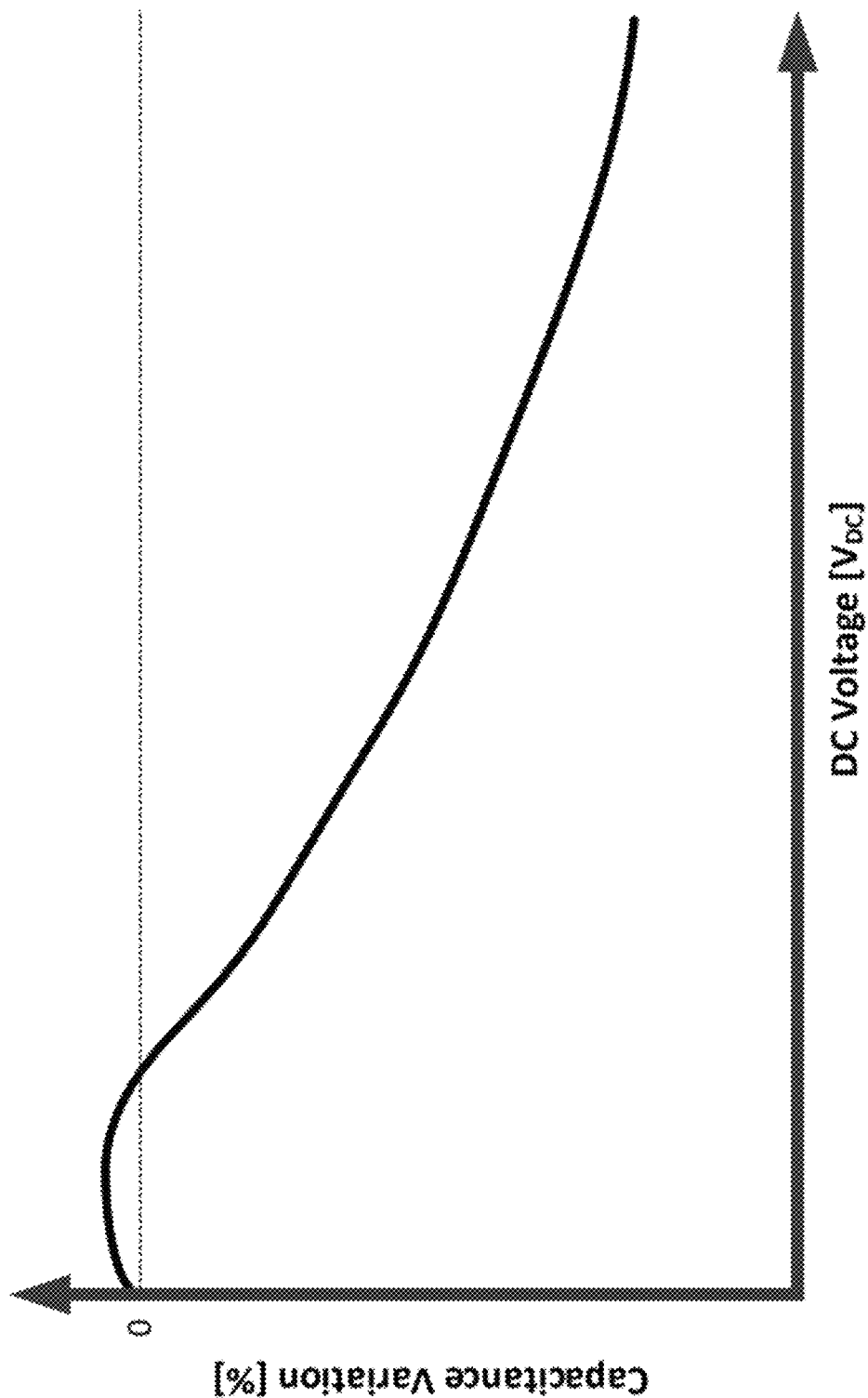
FIG. 3B shows a graph of capacitance for an example variable capacitance circuit that may be used in an example system.

As shown in FIG. 3A, there might be difference between resonant frequency of the LC tank circuit and the resonant frequency of the MEMs Mirror across the PVT variations. As a result, the resonant frequency of the LC tank circuit needs to be adjusted to align with resonant frequency of the MEMs Mirror for the most efficient driving capability. The variable capacitance 222 has DC bias characteristics where the capacitance value varies over DC bias voltage. FIG. 3B shows a graph of capacitance for an example variable capacitance circuit that may be used in an example system. When the resonant frequency of the LC tank is observed to be lower than resonant frequency of the MEMs Mirror, the resonant frequency of the LC tank circuit can be moved to a higher frequency by increasing the DC bias voltage, which reduces the overall value of the variable capacitance 222. Similarly, when the resonant frequency of the LC tank circuit is higher than the resonant frequency of the MEMs Mirror, the LC tank circuit can be moved to a lower frequency by decreasing the DC bias voltage, which increases the overall value of the variable capacitance 222. Thus, there is an observable increase in power efficiency (e.g., transfer of energy from the driver circuit 110 is improved), when the resonant frequency of the LC tank circuit and the resonant frequency of the MEMs Mirror are well aligned.

When the resonant frequency of the LC tank circuit is misaligned with the resonant frequency of the MEMs Mirror, a signal loss is observed (e.g. see the notch in FIG. 3A). Thus, the driving signal for the MEMs Mirror should be increased to achieve the required driving signal strength and thus power consumption will be increased. One possible way to achieve the power optimization would be to specifically select the on-board capacitors of the LC tank circuit for each MEMs Mirror. However, MEMS mirrors may have different parasitic capacitance values that vary from device to device (e.g., from the manufacturing process) and thus it may be impractical and expensive in terms of the time and effort to optimize the specific capacitor values. The DC bias control scheme described herein is a practical way to achieve the desired result (e.g., power optimization at a practical cost).

Figure 4:
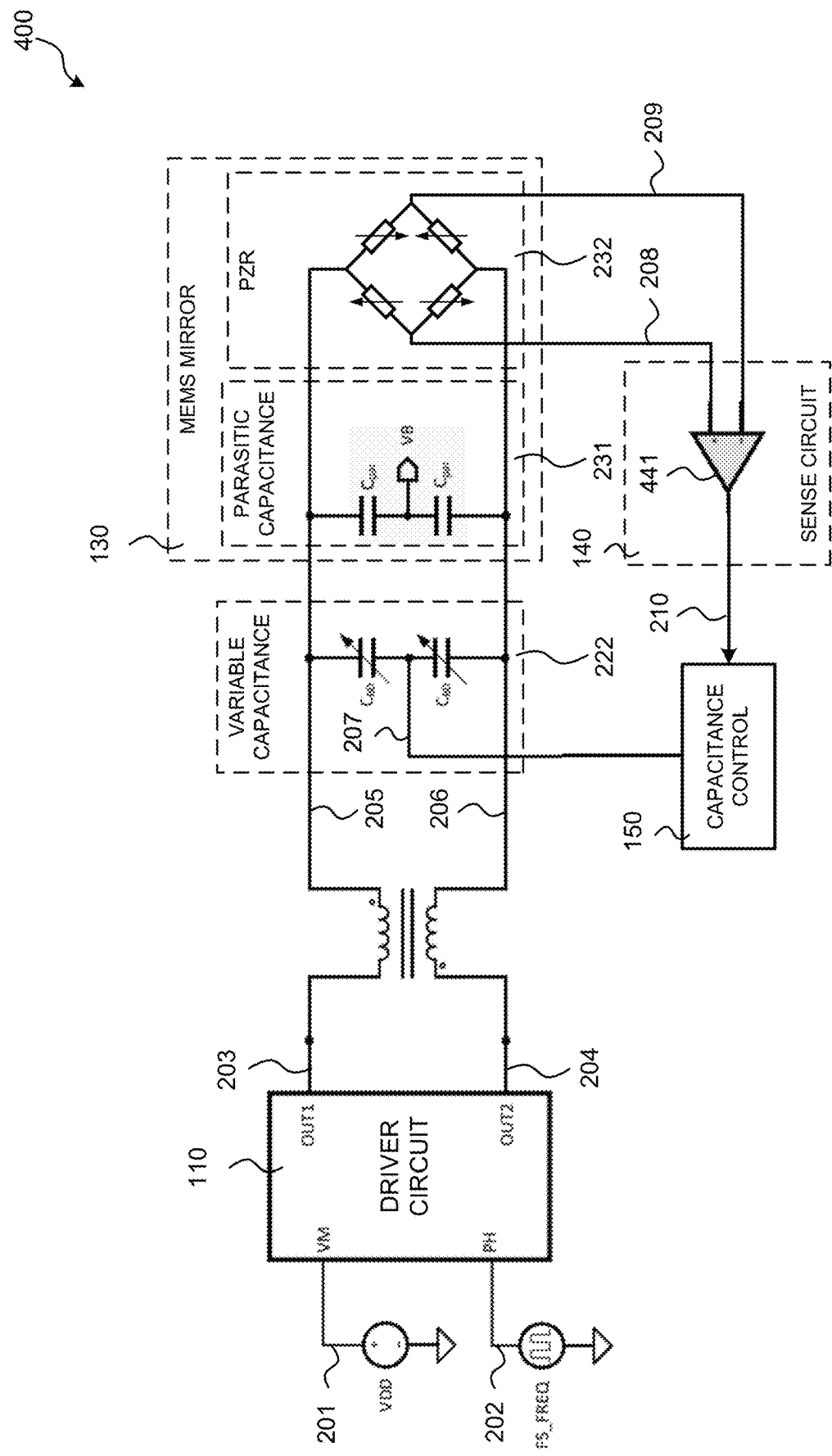
FIG. 4 shows a detailed schematic diagram of still another system with enhanced resonance control.

FIG. 4 shows a detailed schematic diagram of still another system 400 with enhanced resonance control, arranged in accordance with aspects of the present invention. System 400 includes a driver circuit 110, a resonance circuit 120, a mirror device 130, a sense circuit 140, a capacitance control circuit 150, a DC input source (VDD) and an input frequency (FS_FREQ). System 400 is substantially similar to other example systems described herein, with the additional of example sense circuit 140 that includes a sense amplifier 441.

Sense amplifier 441 includes a first input (e.g., +, a non-inverting input) coupled to the first output 208 of the PZR circuit 232, a second input (e.g., −, an inverting input) coupled to the second output 209 of the PZR circuit 232; and an output 210 that is coupled to an input of the capacitance control circuit 150. In operation, the sense amplifier 441 evaluates a differential signal from the outputs (208, 209) of the PZR circuit 232 and generates an output signal responsive to the difference.

In some examples, the amount of gain applied by the sense amplifier 441 may be determined by additional functional blocks or components (not shown). Additionally, the output of the sense amplifier 441 may be filtered (e.g., LPF, HPF, notch filtered, etc.), limited (e.g., clamped), or otherwise conditioned as may be required to improve noise immunity or other characteristics that may be required in a practical implementation.

Figure 5:
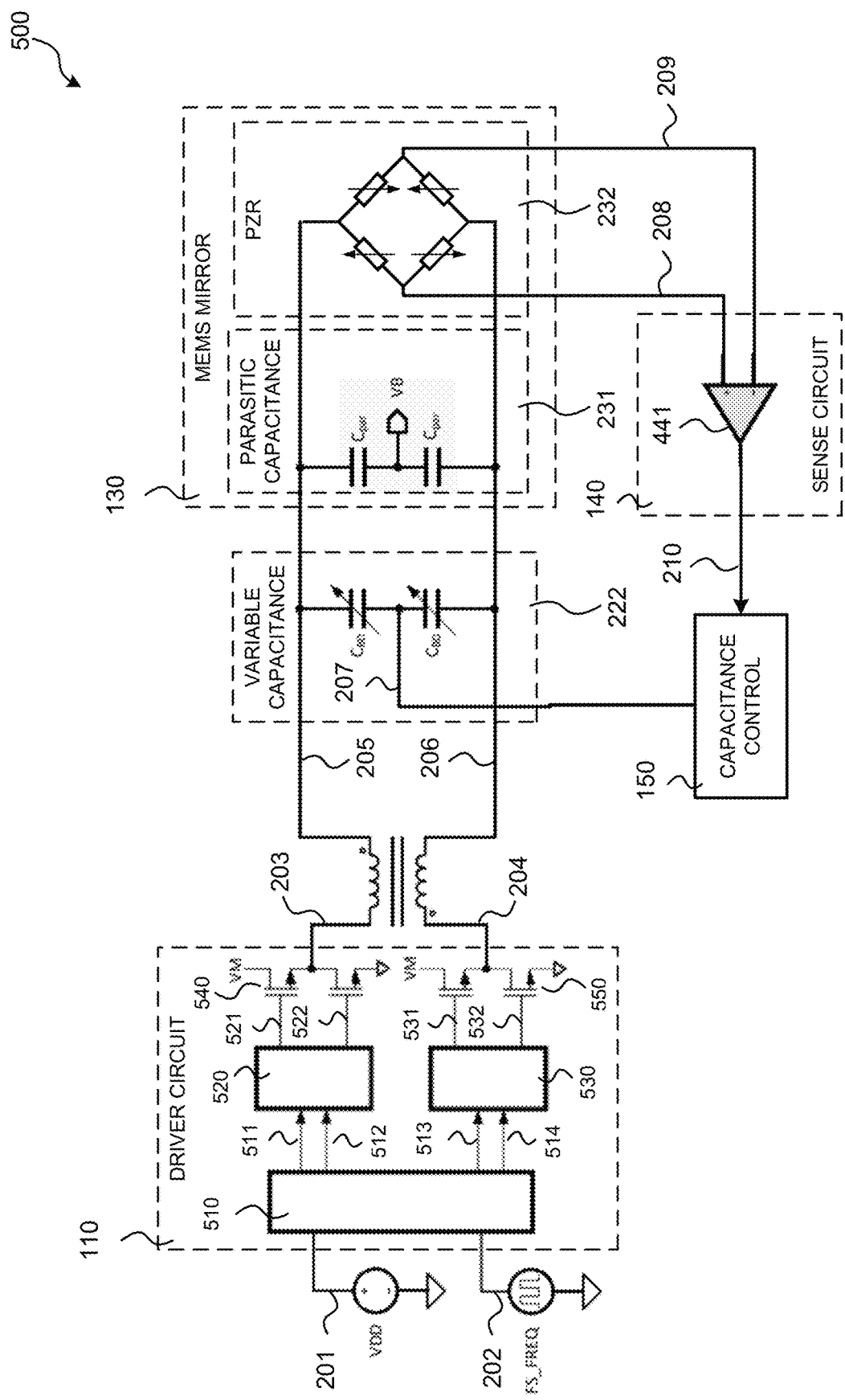
FIG. 5 shows a detailed schematic diagram of yet another system with enhanced resonance control.

FIG. 5 shows a detailed schematic diagram of yet another system 500 with enhanced resonance control, arranged in accordance with aspects of the present invention. System 500 includes a driver circuit 110, a resonance circuit 120, a mirror device 130, a sense circuit 140 with a sense amplifier 441, a capacitance control circuit 150, a DC input source (VDD) and an input frequency (FS_FREQ). System 500 is substantially similar to the other example systems described herein, with the additional of an example driver circuit 110 as will be described below.

Driver circuit 110 of FIG. 5 is an H-bridge driver that includes a driver logic circuit 510, a first gate driver circuit 520, a second gate driver circuit 530, a first switch circuit 540, and a second switch circuit 550. The driver logic circuit 510 includes a first input 201, a second input 202, a first output (511, 512), and a second output (521, 522). The first input 201 of the driver logic circuit 510 is coupled to the DC input source (VDD), which corresponds to the magnitude input (VM). The second input 202 of the driver logic circuit 510 is coupled to the input frequency (FS_FREQ), which corresponds to a phase input (PH). The first gate driver circuit 520 includes an input that is coupled to the first output (511, 512) of the driver logic circuit 510, and an output (521, 522). The second gate driver circuit 520 includes an input that is coupled to the second output (521, 522) of the driver logic circuit 510, and an output (521, 522). The first switch circuit 540 includes an input that is coupled to the output (521, 522) of the first gate driver circuit 520, and an output 203 that is coupled to an input of the first inductor of the resonance circuit. The second switch circuit 540 includes an input that is coupled to the output (531, 532) of the second gate driver circuit 530, and an output 204 that is coupled to an input of the second inductor of the resonance circuit.

The switch circuits described above may correspond to one or more transistor devices that are configured to selectively couple power when activated. In one example, the switch circuit (SW) is a p-type device such as a metal oxide semiconductor device (MOS), a junction field effect transistor (JFET) device, or some other field effect transistor (FET) device. In another example, the switching device (SW) is an n-type device such as a metal oxide semiconductor device (MOS), a junction field effect transistor (JFET) device, or some other field effect device (FET). The switch circuits may further include other components to ensure proper operation.

For the example illustrated in FIG. 5, the first switch 540 includes a first n-type FET with a drain coupled to the high-supply (e.g., VM, VDD, etc.), a gate coupled to node 521 and a source coupled to node 203; and a second n-type FET with a drain coupled to node 203, a gate coupled to node 522 and a source coupled to a low-supply (e.g., GND, VSS, etc.). Also illustrated in FIG. 5, the second switch circuit 550 includes a first n-type FET with a drain coupled to the high-supply, a gate coupled to node 531 and a source coupled to node 204; and a second n-type FET with a drain coupled to node 204, a gate coupled to node 532 and a source coupled to the low-supply.

Selective activation of the first n-type FET of the first switch circuit 540 will provide either a short circuit (low impedance path) or an open circuit (high impedance path) between the high-supply (e.g., VM) and the first output 203 of the driver circuit 100. Selective activation of the second n-type FET of the first switch 540 will provide either a short circuit (low impedance path) or an open circuit (high impedance path) between the low-supply (e.g., GND) and the first output 203 of the driver circuit 100. The first gate driver circuit 520 is typically designed to activate one of the n-type FETs in the switch circuit 540, and maintain the other of the n-type FETs as inactive, as will become apparent from the discussion below. The design of the n-type FETs for the second switch circuit 550, and the second gate driver circuit 530 is substantially similar to the above discussion for the first switch circuit 540 and the first gate driver circuit 520, as will become apparent from the below discussion.

Driver circuit 110 corresponds to a power inverter that converts the DC signal from the power supply into an AC signal to drives the resonance circuit. The operation of the power inverter is controlled by the logic circuit 510, which is configured to selectively activates the switch circuits (540, 550) via their respective gate driver circuits (520, 530) to deliver power to the resonance circuits through the inductors. The first and second switch circuits (540, 550) are effectively arranged as an H-bridge.

In one operating phase of the driver circuit 110, power is delivered from a high-side supply (e.g., VM, VDD, VCC, etc.) through the first switch circuit 540 to the first inductor of the resonance circuit, with a return path from the second inductor of the resonance circuit to a low-side supply (e.g., GND, VSS, VEE, etc.) through the second switch circuit 550. In a second operating phase, power is delivered from the high-side supply through the second switch circuit 550 to the second inductor of the resonance circuit, with a return path from the first inductor of the resonance circuit to a low-side supply through the first switch circuit 550.

Through operation of the various phases of the driver circuit 110 with the switch circuits (520, 530), an alternating power source is effectively delivered to the load, which corresponds to the LC tank circuit and the mirror device, which also operates as an output filter for the H-bridge. The AC voltage is amplified to at the mechanically resonant frequency of the mirror device 130 by the operation of the LC tank circuit. In the LC tank circuit, the overall capacitance is adjusted by the variable capacitance circuit 222 such that the impact of parasitic capacitances on the resonant frequency is mitigated.

The logic circuit 510 can include any circuitry or computing device suitable for generating output signals (511, 512, 513, 514), or switch control signals, that alternate the activation of the first and second switch circuits 540, 550, via their respective gate driver circuits 520, 530, according to a predetermined frequency. In some configurations, with respect to a cycle of the predetermined frequency, a portion of the first switch circuit 540 (e.g., one of the high-side switch and the low-side switch) can be activated at the beginning of the cycle and a portion of the second switch circuit 550 may be activated at a middle of the cycle (at 180 degrees). The activation period, which is referred to herein as a duty cycle, for each switch control signal can have a duty cycle that is less than 50% of the cycle. In some configurations, the duty cycle of each switch control signal can be within a range of 2% and 20% of a cycle. In one example, the first switch circuit 540 can be about 2% to 20% of the cycle and the second switch circuit 550 can be 2 to 20% of the cycle, depending on the power level. Such values of the duty cycle can provide optimal power efficiency. These examples are provided for illustrative purposes and are not to be construed as limiting.

It can be appreciated that other components and/or arrangements can be used to achieve the techniques described herein, and these examples are provided for illustrative purposes.

Figure 6:
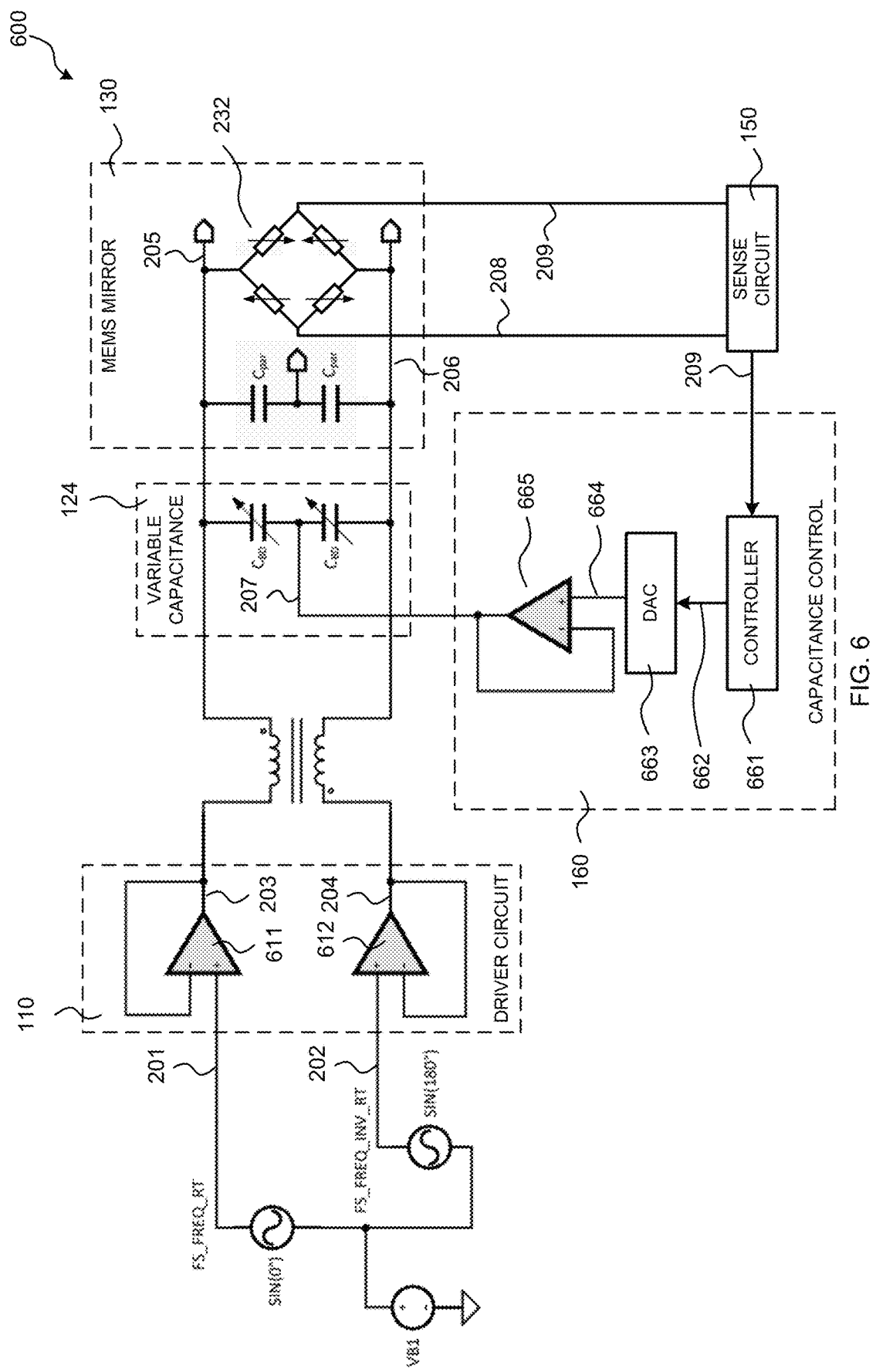
FIG. 6 shows a detailed schematic diagram of still yet another system with enhanced resonance control.

FIG. 6 shows a detailed schematic diagram of still yet another system 600 with enhanced resonance control, arranged in accordance with aspects of the present invention. System 600 includes a driver circuit 110, a resonance circuit 120, a mirror device 130, a sense circuit 140, a capacitance control circuit 150, a DC input source (VB1), an sine wave source (FS_FREQ_RT), and an inverse sine source (FS_FREQ_INV_RT). System 600 is substantially similar to the other example systems described herein, with the addition of another example driver circuit 110, and an example capacitance control circuit 160 as will be described below.

Driver circuit 110 corresponds to an AC driver that is configured to drive the resonance circuit. The driver circuit 110 is illustrated as including a first amplifier 611 and a second amplifier 612, each shown in a buffer configuration. The first amplifier 611 includes a first input (e.g., + or a non-inverting input), a second input (e.g., a—or inverting input), and an output 203 that is coupled to the second input of the first amplifier 611. The second amplifier 612 includes a first input (e.g., + or a non-inverting input), a second input (e.g., a—or inverting input), and an output 204 that is coupled to the second input of second amplifier 612. The DC input source (VB1) is coupled to a common node. The sine wave source (FS_FREQ_RT) is coupled between the common point and the first input of the first amplifier 611 of the driver circuit 110 at node 201. The inverse sine wave source (FS_FREQ_INV_RT) is coupled between the common point and the first input of the second amplifier 612 of the driver circuit 110 at node 202. Although the driver circuit is shown as amplifiers in a buffer configuration, this is merely one example and in other examples the amplifiers 611, 612 may be in another configuration to apply gain.

The operation of driver circuit 110 is similar to the H-bridge configuration of FIG. 5, but without the use of switches and pulsed signals. The sine wave source (FS_FREQ_RT) and the inverse sine wave source (FS_FREQ_INV_RT), which are 180 degrees out of phase with one another, have a common DC bias shown as VB1. In a first phase of operation of driver circuit 110, where the sine-wave source is on a positive cycle and the inverse sine-wave source is on a negative cycle, power is delivered from the first amplifier 611 through the first inductor of the resonance circuit, with a return path from the second inductor of the resonance circuit through the second amplifier 612. In a second operating phase of driver circuit 100, where the sine-wave source is on a negative cycle and the inverse sine-wave source is on a positive cycle, power is delivered from the second amplifier 612 to the second inductor of the resonance circuit, with a return path through the first inductor of the resonance circuit to the first amplifier 611.

Through operation of the various phases of the driver circuit 110, on positive and negative cycles, an alternating power source is delivered to load, which corresponds to the LC tank circuit and the mirror device 130. The AC voltage is amplified to at the mechanically resonant frequency of the mirror device 130 by the operation of the LC tank circuit. In the LC tank circuit, the overall capacitance is again adjusted by the variable capacitance circuit 222 such that the impact of parasitic capacitances on the resonant frequency is mitigated.

The capacitance control circuit 610 of FIG. 6 includes a controller (or controller logic) 661, a digital-to-analog converter (DAC) 663, and an amplifier 665. The controller includes an input that is coupled to the output 209 of the sense circuit 150, and an output 662. DAC 663 includes an input that is coupled to the output 662 of the controller 661, and an output 664. The amplifier 665 includes a first input (e.g., + or non-inverting input) that is coupled to the output of DAC 663, a second input (e.g., – or inverting input) that is coupled to the output of amplifier 665, which corresponds to the control input 207 of the variable capacitance circuit 207.

The controller is configured to receive the output of the sense circuit, the sense signal, and to control conversion of the sense signal, by the DAC 663, into a control signal that may be used by the variable capacitance circuit 124. Although the amplifier 665 is shown in a buffer or unity gain configuration, which simply buffers the output of the DAC 663, this is merely one example and in other examples the amplifier 665 may be in another configuration to apply gain.

The controller 661 may include any variety of functions or blocks as may be required in a particular implementation. For example, the controller may include additional logic, buffers, or other components. In a simplest implementation, the controller may be replaced by a buffer that merely captures the output 209 of the sense circuit 150.

By adjusting the control signal for the variable capacitance circuit, the overall frequency of the LC tank circuit can be tuned to the appropriate frequency for the mirror device 130. In a simple implementation, the adjustment can be controlled by DAC 663 with the buffer 665.

The controller 661 can be configured to monitor the signal strength of the mirror device 130 and adjust the value (e.g. the bias control value or control code) to the DAC 665 to effectively maximize the signal strength. For example, the controller 661 may be configured to receive the sense signal from the sense circuit, compare a current value of the sense signal to a prior peak value of the sense signal, and adjust the value (e.g., bias control value) based on the comparison. The digital-to-analog converter (DAC) can be configured to receive the bias control value from the controller and generate the bias control signal from the bias control value. When the bias control signal (e.g., the DC voltage applied at 207) to the variable capacitance circuit 124 is at the appropriate value, the signal strength will achieve a peak such that the LC tank resonant frequency and the mirror device resonant frequency are well-aligned.

Figure 7:
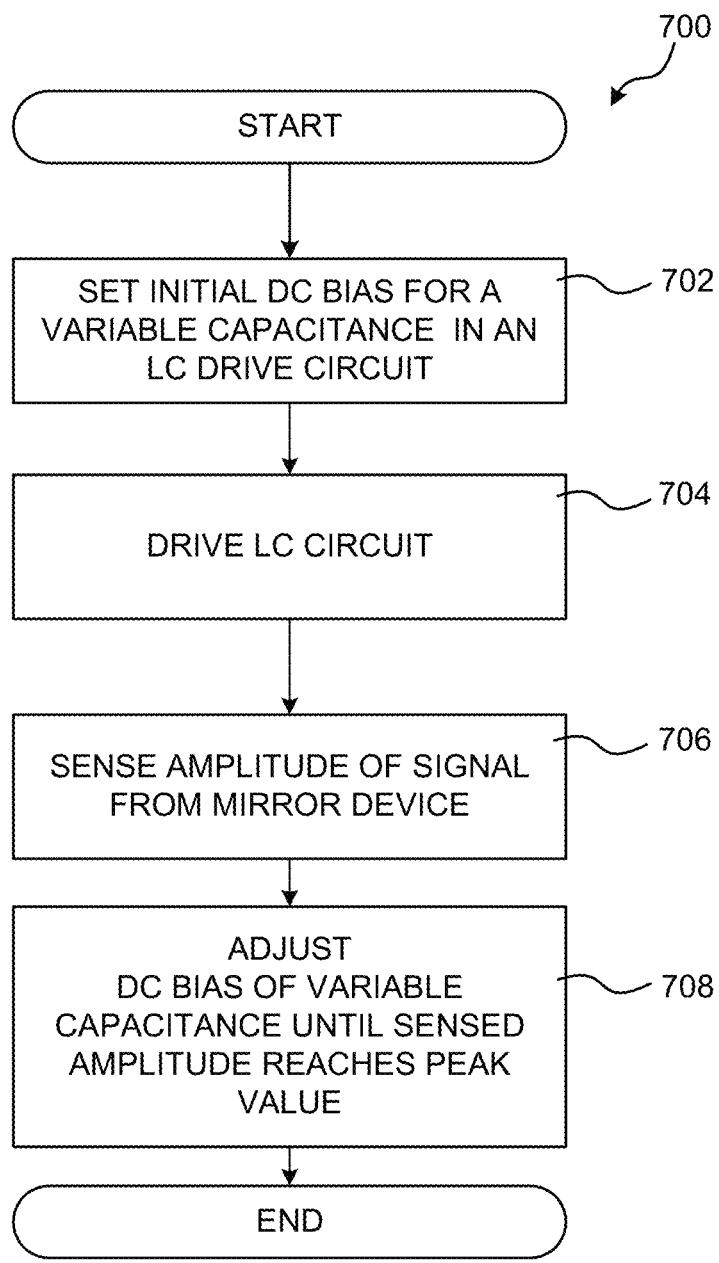
FIG. 7 shows a flow chart for an example system with enhanced resonance control.

FIG. 7 shows a flow chart 700 for a system with enhanced resonance control, arranged in accordance with aspects of the present invention. Other logical flows can be implemented using the circuits described herein, as the logical flow disclosed herein is provided for illustrative purposes and is not to be construed as limiting. The logical flow described herein can be implemented by a system 100 having a driver circuit 110, a resonance circuit 120 with a variable capacitance circuit 122, a sense circuit, and a capacitance control circuit 150. The method 700 can also be implement it on a system where the capacitance control circuit 150 includes a controller 661.

The logical flow for method 700 starts at block 702, "SET INITIAL DC BIAS FOR A VARIABLE CAPACITANCE IN AN LC DRIVE CIRCUIT." At block 702, the capacitance control circuit 150 generates an initial DC bias for the variable capacitance circuit 122 of the resonance circuit 120. The resonance circuit 120 corresponds to the LC drive or tank circuit that is coupled to a mirror device 130, which is a MEMS based device that has an inherent physical resonant frequency. By setting the initial DC bias, the resonance circuit 120 has an initial set point for its resonant frequency. In some examples, the initial DC bias may correspond to a DC bias value that is a numerical quantity that can be leveraged by the DAC.

Processing continues from block 702 to block 704, "DRIVE LC CIRCUIT". At block 704, the driver circuit 110 is activated to alternately drive the resonance circuit at a predetermined frequency. For example, once activated, the driver circuit couples energy to the resonance circuit in a first direction during a first phase of operation, and in a second direction during a second phase of operation. The duty cycle of the first and second phases may be varied to a desired pulse width at the predetermined frequency. The alternating drive of the resonance circuit 120 results in a drive signal to the mirror device 130, where the signal amplitude to drive the mirror device 130 is frequency dependent based on the resonant frequency of the resonance circuit and the resonant frequency of the mirror device, which may be mismatched. The drive signal actuates the motion of the mirror at a frequency via one or more piezo actuator (PA) devices.

Processing continues from block 704 to block 706, "SENSE AMPLITUDE OF SIGNAL FROM MIRRO DEVICE". At block 706, the sense circuit 140 detects the output signal from the mirror device 130 and generates a sense signal. The sense signal, which may optionally be gain scaled or filtered, indicates a signal amplitude level of the mirror device at the current resonance conditions.

Processing continues from block 706 to block 708, "ADJUST DC BIAS OF VARIABLE CAPACITANCE UNTIL SENSED AMPLITUDE REACHES PEAK VALUE". At block 708, the capacitance control circuit 150 receives the sensed amplitude (or peak signal) of the output signal from the sense circuit 140, and evaluates the current value of the sensed amplitude and compares the current value to the initial value to determine if the peak signal level for the sensed amplitude is lower (decreased) or higher (increased) than the initially sensed amplitude (or peak signal). The capacitance control circuit 150 will then adjust the DC bias to the variable capacitance circuit 122, based on the comparison to effect a change in the resonant frequency to achieve a peak in the sense signal.

Figure 8:
FIG. 8 shows an example of pseudo-code for a capacitance control circuit in an example system with enhanced resonance control.

FIG. 8 shows an example of pseudo-code 800 for a capacitance control circuit in an example system with enhanced resonance control, arranged in accordance with aspects of the present invention. The illustrated example may be used for detection and adjustment provided in any of the prior discussed examples.

As illustrated by the pseudo code, an initial DC Bias Value (e.g., START_VAL) can be assigned (or selected) by the capacitance control circuit 160 as a start condition prior to operation of the LC tank and mirror, OLD_BIAS=START_VAL. The start value can be arbitrarily assigned, picked at an end of the capacitance value curve, or at a midpoint of the curve, etc. The capacitance control circuit 160 can then initialize the variable capacitance circuit 122 to the selected initial DC Bias condition, SET(OLD_BIAS). Then, while the mirror device 130 is driven by the LC tank circuit under these conditions, an initial peak signal level is captured, GET(OLD_PEAK), from the sense circuit 150. The capacitance control circuit 160, having no prior history captured, sets a Boolean flag to indicate this is the first time through the evaluation (FIRST=TRUE), and picks a direction for adjustment (DIR=+1). The capacitance control circuit 160 then selects a new DC bias value to adjust the DC bias value by a nominal amount (DELTA), such as NEW_BIAS=OLD_BIAS+DIR*DELTA, and initializes the variable capacitance circuit to set this new bias value, SET(NEW_BIAS). The adjusted DC bias setting is applied by the variable capacitance circuit 122, and a new process begins.

During the second cycle, the capacitance control circuit 160 again captures the peak signal level, GET (NEW_PEAK), from the sense circuit 150. The capacitance control circuit 160, having a prior history, compares the old peak signal level to the new peak signal level to determine if the current direction of adjustment is yielding increasing values of peak detected signals. If the peak signal is increased after the last adjustment, then the history of the last applied bias condition and detected peak levels are captured (OLD_BIAS=NEW_BIAS, OLD_PEAK=NEW_PEAK), and the current direction continues for the next bias setting. If the peak signal is determined to have decreased after the last adjustment, then direction is reversed (DIR=−1*DIR), the Boolean flag is changed to indicate this is NOT the first time through the evaluation (FIRST=FALSE), the history of the last applied condition and detected peak are discarded since they were for the incorrect direction, and the next bias setting is determined by the prior setting before the decrease in signal level was detected. The process will continue until another decrease in signal level is detected after the Boolean flag indicates that FIRST=FALSE, since a second reverse in direction would indicate a convergence on a bias condition with a peak level in the sensed signal. Thus, a detection of a second decrease in signal level indicates the prior solution yielded a peak signal level, BIAS=OLD_BIAS, and processing has concluded as successful.

It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the appended claims. It also should be understood that the illustrated methods can be ended at any time and need not be performed in its entirety.

The above specification, examples and data provide a complete description of the manufacture and use of the composition of the invention. Since many embodiments of the invention can be made without departing from the spirit and scope of the invention, the invention resides in the claims hereinafter appended.

CONCLUSION

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A system to efficiently drive a mirror device, the system comprising:
    a driver circuit configured to generate an alternating drive signal;
    a resonance circuit that is configured to receive the alternating drive signal from the driver circuit, wherein:
        the resonance circuit is coupled to the mirror device and configured to drive the mirror device responsive to the alternating drive signal;
        the resonance circuit includes a variable capacitance circuit that has a capacitance value that varies in response to a bias control input signal;
        the resonance circuit has a resonant frequency that is determined at least in part by the capacitance value of the variable capacitance circuit; and
    a sense circuit that is configured to generate a sense signal responsive to an output of the mirror device; and
    a capacitance control circuit that is configured to receive the sense signal and adjust the bias control signal of the variable capacitance circuit until a peak signal level is observed in the sense signal, wherein the peak signal level indicates a matched resonant frequency of the mirror device and the resonance circuit.

2. The system of claim 1, wherein the resonance circuit further comprises an inductance circuit that forms a resonant tank circuit with the variable capacitance circuit.

3. The system of claim 2, wherein the inductance circuit includes a first inductor and a second inductor, wherein a first output of the driver circuit is series coupled to the first inductor of the resonance circuit, a second output of the driver circuit is series coupled to the second inductor of the resonance circuit, wherein the first inductor and the second inductor are cross-coupled with opposite polarities.

4. The system of claim 3, wherein the variable capacitance circuit includes a first variable capacitor and a second variable capacitor, wherein
    the first variable capacitor is series coupled between a first output of the resonance circuit and a common point;
    the second variable capacitor is series coupled between the common point and a second output of the resonance circuit; and
    the common point of the first and second variable capacitors (CBD) are coupled to a bias control input of the resonance circuit.

5. The system of claim 4, wherein the capacitance control circuit is configured to adjust the resonant frequency of the resonance circuit based on the sense signal from the sense circuit, wherein the bias control signal is increased by the capacitance control circuit to increase the resonant frequency of the resonance circuit; and the bias control signal is decreased by the capacitance control circuit to decrease the resonant frequency of the resonance circuit.

6. The system of claim 4, wherein the capacitance control circuit is configured to adjust the resonant frequency of the resonance circuit based on the sense signal from the sense circuit, wherein the bias control signal is increased by the capacitance control circuit to increase the resonant frequency of the resonance circuit; the bias control signal is decrease by the capacitance control circuit to decrease the resonant frequency of the resonance circuit; and wherein the capacitance control circuit is configured to selectively increase or decrease the resonance frequency of the resonance circuit until a peak level is detected from the sense signal.

7. The system of claim 1, wherein the mirror device includes a piezoresistive (PZR) circuit that is a resistive bridge that generates a differential signal that indicates a strain on the mirror device based on variations in a resistance of the resistive bridge, wherein the sense signal corresponds to the differential signal, which indicates an output level of the mirror device.

8. The system of claim 7, wherein the sense circuit comprises a sense amplifier that receives the differential signal from the PZR circuit, and generates the sense signal responsive to the differential signal.

9. The system of claim 1, wherein the capacitance control circuit comprises a controller configured to receive the sense signal from the sense circuit, compare a current value of the sense signal to a prior peak value of the sense signal, and adjust a bias control value based on the comparison.

10. The system of claim 9, wherein the capacitance control circuit further comprises a digital-to-analog (DAC) converter that is configured to receive the bias control value from the controller and generate the bias control signal from the bias control value.

11. The system of claim 10, wherein the capacitance control circuit further comprises an amplifier circuit, wherein the DAC is configured to receive the bias control value from the controller and generate a DAC output signal that is coupled to an input of the amplifier circuit, wherein the amplifier circuit is configured to generate the bias control signal responsive to the DAC output signal.

12. A method to adjust a resonant frequency of an LC driver circuit for a mirror device, the method comprises:
    setting, by a capacitance control circuit, a DC bias for a variable capacitance circuit in an LC driver circuit to an initial value;
    alternately driving, by a driver circuit, energy to the LC driver circuit in a first direction during a first phase of operation, and in a second direction during a second phase of operation;
    sensing, by a sense circuit, an amplitude of an output signal from the mirror device when the mirror device is alternately driven by the driver circuit; and
    adjusting, by the capacitance control circuit, the DC bias for the variable capacitance circuit to an adjusted value that is responsive to the sensed amplitude of the output signal from the mirror device until the sensed amplitude reaches a peak value, whereby the peak value of the sensed amplitude corresponds to a well-matched resonant frequency between the LC driver circuit and the mirror device.

13. The method of claim 12, wherein sensing further comprises one or more of amplifying a differential output signal from the mirror device, buffering a differential output signal from the mirror device, filtering a differential output signal from the mirror device, or gain scaling the differential output signal from the mirror device.

14. The method of claim 12, wherein setting the DC bias for the variable capacitance circuit in the LC driver circuit to the initial value further comprises:
    selecting the initial value for the DC bias;
    setting a DC bias signal based on the initial value; and
    coupling the DC bias signal to the variable capacitance circuit.

15. The method of claim 14, wherein setting the DC bias signal comprises converting the initial value to the DC bias signal with a digital-to-analog converter (DAC) that is responsive to the initial value.

16. The method of claim 12, wherein adjusting, by the capacitance control circuit, the DC bias for the variable capacitance circuit, further comprises:
   evaluating an initial amplitude value of the sensed amplitude of the output signal from the mirror device when the DC bias corresponds to the initial value;
   selecting the adjusted value to change the DC bias by an amount;
   setting the variable capacitance circuit with the adjusted value;
   after setting the variable capacitance circuit with the adjusted value:
   evaluating a current amplitude value of the sensed amplitude of the output signal from the mirror device;
   comparing the current amplitude value to the initial amplitude value to determine if the peak value has increased or decreased.

17. The method of claim 16, wherein adjusting, by the capacitance control circuit, the DC bias for the variable capacitance circuit, further comprises continuing to change the adjusted value in a same direction when the current amplitude value has been determined to have increased relative to the initial amplitude value.

18. The method of claim 16, wherein adjusting, by the capacitance control circuit, the DC bias for the variable capacitance circuit, further comprises reversing a direction of change to the adjusted value when the current amplitude value is has been determined to have decreased relative to the initial amplitude value.

19. A method to adjust a resonant frequency of an LC driver circuit for a mirror device, the method comprises:
   assigning, by a capacitance control circuit, an initial DC bias value for a variable capacitance circuit in an LC driver circuit;
   initializing, by the capacitance control circuit, the variable capacitance circuit to set the initial DC bias value;
   alternately driving, by a driver circuit, energy to the LC driver circuit, wherein a resonant frequency of the LC driver circuit is determined in part by the variable capacitance circuit, parasitic capacitances of the system, and parasitic capacitances of the mirror device;
   capturing, by the capacitance control circuit, an initial peak signal level from a sense circuit when the LC driver circuit is operated by the driver circuit with the initial DC bias value;
   selecting, by the capacitance control circuit, a new DC bias value for the variable control circuit of the LC driver circuit;
   initializing, by the capacitance control circuit, the variable capacitance circuit to set the new DC bias value;
   capturing, by the capacitance control circuit, a new peak signal level from the sense circuit when the LC driver circuit is operated by the driver circuit with new DC bias value;
   comparing the initial peak signal level to the new peak signal level to determine if the peak signal level has increased or decreased;
   when the peak signal level is determined to have increased, continuing in a same direction of the adjustment to the DC bias value;
   when the peak signal level is determined to have decreased for a first time, reversing the direction of adjustment to the DC bias value; and
   when the peak signal level is determined to have decreased for a second time, terminating the current adjustment to the DC bias value and reverting to the prior DC bias value.

20. The method of claim 19, wherein initializing, by the capacitance control circuit, the variable capacitance circuit to set the initial a DC bias value comprises setting an input code to a digital-to-analog converter (DAC).

* * * * *